(12) United States Patent
Chen et al.

(10) Patent No.: US 6,420,258 B1
(45) Date of Patent: Jul. 16, 2002

(54) SELECTIVE GROWTH OF COPPER FOR ADVANCED METALLIZATION

(75) Inventors: Sheng Hsiung Chen, Taichung; Ming-Hsing Tsai, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/434,564

(22) Filed: Nov. 12, 1999

(51) Int. Cl.⁷ .......................................... H01L 21/4763
(52) U.S. Cl. ................... 438/622; 438/625; 438/626; 438/627; 438/628; 438/629; 438/633; 438/637; 438/643; 438/645; 438/648; 438/653; 438/654; 438/656; 438/672; 438/675; 438/678; 438/687
(58) Field of Search ....................... 438/622, 625–629, 438/631, 633, 637–638, 643, 645, 648, 653, 654, 656, 666, 672, 675, 678, 679, 687

(56) References Cited

U.S. PATENT DOCUMENTS

| | | | |
|---|---|---|---|
| 4,866,008 A | 9/1989 | Brighton et al. ............ 437/189 |
| 5,112,448 A | 5/1992 | Chakravorty ............... 205/118 |
| 5,429,987 A | 7/1995 | Allen .......................... 437/187 |
| 5,789,320 A | 8/1998 | Andricacos et al. ........ 438/678 |
| 5,824,599 A | 10/1998 | Schacham-Diamand et al. . 438/678 |
| 5,891,804 A | 4/1999 | Havemann et al. ......... 438/674 |
| 6,015,749 A | * 1/2000 | Liu et al. ..................... 438/628 |
| 6,037,258 A | * 3/2000 | Liu et al. ..................... 438/687 |
| 6,080,656 A | * 6/2000 | Shih et al. ................... 438/626 |
| 6,133,144 A | * 10/2000 | Tsai et al. .................... 438/622 |
| 6,140,241 A | * 10/2000 | Shue et al. ................... 438/692 |
| 6,174,812 B1 | * 1/2001 | Hsiung et al. ............... 438/687 |
| 6,211,085 B1 | * 4/2001 | Liu ............................. 438/687 |
| 6,224,737 B1 | * 5/2001 | Tsai et al. .................... 205/123 |
| 6,271,136 B1 | * 8/2001 | Shue et al. ................... 438/687 |

\* cited by examiner

*Primary Examiner*—John F. Niebling
*Assistant Examiner*—Lynne Gurley
(74) *Attorney, Agent, or Firm*—George O. Saile; Stephen B. Ackerman

(57) ABSTRACT

A novel and improved method of fabricating an integrated circuit, in which special copper films are formed by a combination of physical vapor deposition (PVD), chemical mechanical polish (CMP) and electrochemical copper deposition (ECD) techniques. The methods of the present invention make efficient use of several process steps resulting in less processing time, lower costs and higher device reliability. By these techniques, high aspect ratio trenches can be filled with copper without the problem of dishing. A special, selective electrochemical deposition (ECD) of copper metal is utilized taking place only on the seed layer in the trench. This auto-plating or "plate-up" occurs only in the trench and provides good sealing around the trench perimeter and fine copper metal coverage of the trench for subsequent robust interconnects. The selective plating of copper provides a robust copper film that is easily removed by subsequent chemical mechanical polish (CMP) and tends to be more uniform and free of the usual defects associated with CMP films.

33 Claims, 2 Drawing Sheets

SELECTIVE GROWTH OF COPPER FOR ADVANCED METALLIZATION

BACKGROUND OF THE INVENTION

(1) Field of the Invention

It is a general object of the present invention to provide a new and improved method of forming an integrated circuit in which special copper interconnects are formed by a combination of physical vapor deposition (PVD) and electrochemical copper deposition (ECD) techniques. By said techniques, high aspect ratio vias and trenches can be filled with copper which is electromigration resistant since interconnects are chemical mechanical polished (CMP) back without dishing effects yielding full cross-sectional lines.

As a background to the current invention, the requirement of lower resistance material has been more stringent as the device dimensions approach micron and sub-micron design ground rules. Pure copper metal lines have been one of the best choices because of copper's low resistivity and high conductivity. This invention describes the formation of copper films by using a combination of physical vapor deposition (PVD) and electrochemical copper deposition (ECD) techniques. By said techniques, high aspect ratio vias and trenches can be filled with copper without the problem of dishing.

(2) Description of Related Art

The present invention is a new and improved method for fabricating special copper films by using a combination of physical vapor deposition (PVD) and electrochemical copper deposition (ECD) techniques. By said techniques, high aspect ratio vias and trenches can be filled with copper. High conductivity, low resistivity conducting metal lines are important in fabricating quarter micron and below semiconductor devices. The related Prior Art background patents will now be described in this section. These related Prior Art patents are presented with the most recent art described first.

U.S. Pat. No. 5,891,804 entitled "Process for Conductors with Selective Deposition" granted Apr. 6, 1999 to Havermann and Stoltz describes a selective copper deposition using various initiator metals. A method of forming a conductor on an interlevel dielectric layer which is over an electronic microcircuit substrate is described. The method utilizes: forming an intralevel dielectric layer over the interlevel dielectric layer; forming a conductor groove in the intralevel dielectric layer exposing a portion of the interlevel dielectric layer; anisotropically depositing a selective deposition initiator onto the intralevel dielectric layer and onto the exposed portion of the interlevel dielectric layer; and selectively depositing conductor metal to fill the groove to at least half-full. The selective deposition initiator may selected from the group consisting of tungsten, titanium, palladium, platinum, copper, aluminum, and combinations thereof. In one embodiment, the selective deposition initiator is palladium, and the selectively deposited conductor metal is principally copper.

U.S. Pat. No. 5,824,599 entitled "Protected Encapsulation of Catalytic Layer for Electroless Copper Interconnect" granted Oct. 20, 1998 to Schacham-Diamand et al shows a selective electroless deposition for a copper interconnect. Once a via or a trench is formed in a dielectric layer, a titanium nitride (TiN) or tantalum (Ta) barrier layer is deposited. Then, a catalytic copper seed layer is conformally blanket deposited in vacuum over the barrier layer. Next, without breaking the vacuum, an aluminum protective layer is deposited onto the catalytic layer to encapsulate and protect the catalytic layer from oxidizing. An electroless deposition technique is then used to auto-catalytically deposit copper on the catalytic layer. The electroless deposition solution dissolves the overlying protective layer to expose the surface of the underlying catalytic layer. The electroless copper deposition occurs on this catalytic surface, and continues until the via/trench is filled. Subsequently, the copper and barrier material are polished by an application of chemical-mechanical polishing (CMP) to remove excess copper and barrier material from the surface, so that the only copper and barrier material remaining are in the via/trench openings. Then an overlying silicon nitride (SiN) layer is formed above the exposed copper in order to form a dielectric barrier layer. The copper interconnect is fully encapsulated from the adjacent material by the TiN (or Ta) barrier layer and the overlying SiN layer.

U.S. Pat. No. 5,789,320 entitled "Plating of Noble Metal Electrodes for DRAM and FRAM" granted Aug. 4, 1998 to Andricacos et al describes a noble metal plating process on a preexisting seed layer which is used in the fabrication of electrodes for DRAM and FRAM. The plating may be spatially selective or nonselective. In the nonselective case, a blanket film is first plated and then patterned after deposition by spatially selective material removal. In the selective ease, the plated deposits are either selectively grown in lithographically defined areas by a through-mask plating technique, or selectively grown as a conformal coating on the exposed regions of a preexisting electrode structure. A diamond-like carbon mask can be used in the plating process. A self-aligned process is disclosed for selectively coating insulators in a through-mask process.

U.S. Pat. No. 5,429,987 entitled Method of Profile Control of Selective Metallization" granted Jul. 4, 1995 to Allen describes a selective copper deposition for forming interconnects. The method comprises: (a) depositing a selective nucleating layer on the dielectric layer; (b) depositing a sacrificial layer over the nucleating layer; (c) pattering the sacrificial layer and nucleating layer such that the resulting pattern of the nucleating layer and sacrificial layer is equivalent to the desired pattern of conductive lines (d) depositing a sidewall guide material over the patterned sacrificial and nucleating layers; (e) forming sidewall guides; (f) removing the sacrificial layer; and (g) depositing conductive material between the sidewall guides and on the nucleating layer. The nucleating layer may comprise titanium nitride, the sacrificial layer may comprise silicon dioxide, the sidewall guide material may comprise silicon nitride, and the conductive material may comprise copper. In another aspect of the invention, a layer of silicon nitride may be provided over the conductive material.

U.S. Pat. No. 5,112,448 entitled "Self-Aligned Process for Fabrication of Interconnect Structures in Semiconductor Applications" granted May 12, 1992 Chakravorty shows a seed layer deposition over polyimide steps. These polyimide steps are utilized to break electrical connection of the seed layer, so that electroplating of copper occurs only in the trenches. The method of fabricating conductors in dielectric trenches is performed in self-aligned manner. Interconnect modules with a high conductor density are achieved by using a copper-polyimide system as a versatile packaging approach. A photosensitive polyimide is applied to a substrate and lithographically patterned to form polyimide steps having a characteristic positive slope, between which are defined trenches in which the substrate is exposed. A thin electroplating seed layer is deposited over the polyimide steps and the substrate. Copper is electroplated into trenches, but does not plate onto the tops of the polyimide steps, since the electroplating seed layer at that location is not electrically connected to the electroplating seed layer in the bottom of the trenches. The electroplating seed layer on top of the polyimide steps is then removed by chemical etching, plasma machining, or ion-milling. A planar structure is eventually obtained without the use of multiple coatings of polyimide layers or any additional masking layers or lift-off layers.

U.S. Pat. No. 4,866,008 entitled "Method for Forming Self-Aligned Conductive Pillars on Interconnects" granted Sep. 12, 1989 to Brighton and Roane describes a via plug on an metal interconnect using a photoresist mask. Disclosed are methods of forming a self-aligned conductive pillar on an interconnect on a body having semi-conducting surfaces. A first mask defines an inverse pattern for formation of an interconnect. The interconnect is formed by additive metallization processes. A second mask is formed over portions of the first mask and the interconnect. Sidewalls of the first mask which define at least one side of side of said interconnect serve to also define at least one side of said conductive pillar. The second mask also defines at least one side of the conductive pillar. The conductive pillar is formed by additive metal deposition processes. The conductive pillar or metal via plug (W plugs) is thus self-aligned to the interconnect on which it is formed. A cladding layer of tungsten can be used on the multiple layers of seed layer, e.g., molybdenum coated with thin copper, of copper interconnects, and of conductive pillars. Feed layer of nickel and gold interconnect are also disclosed.

The present invention is directed to a novel and improved method of fabrication an integrated circuit, in which special copper films are formed in a dual damascene process, by a combination of physical vapor deposition (PVD), chemical mechanical polish (CMP), and electrochemical copper deposition (ECD) techniques. The methods of the present invention make efficient use of several process steps resulting in less processing time, lower costs and higher device reliability. By said techniques, high aspect ratio vias and trenches can be filled with copper without the problem of dishing.

SUMMARY OF THE INVENTION

It is a general object of the present invention to provide a new and improved method of forming an integrated circuit in which special copper films are formed by a combination of physical vapor deposition (PVD) and electrochemical copper deposition (ECD). By said techniques, high aspect ratio trenches can be selectively filled with copper, which are electromigration resistant since the robust interconnects are formed without chemical mechanical polish (CMP) dishing effects.

As a background to the current invention, the requirement of lower resistance material has been more stringent as the device dimensions approach micron and sub-micron design ground rules. Pure copper metal lines have been one of the best choices because of copper's low resistivity and high conductivity. This invention describes the formation of copper films by using a combination of physical vapor deposition (PVD), selective chemical mechanical polish (CMP) and electrochemical copper deposition (ECD) techniques. By said techniques, high aspect ratio trenches can be filled with robust copper metal without the problem of dishing.

As a background to the present invention, provided by Prior Art methods are the following: a semiconductor silicon substrate with the first level of metal copper wiring being defined, on the first layer of insulator, silicon oxide $SiO_x$. The invention starts with these conventional layers being provided by Prior Art methods, in addition, to patterned and etched trenches, being defined in deposited insulating material.

The starting point of this invention is the conformal blanket deposition of a met al diffusion barrier layer, beneath subsequent metal copper wiring layers. To obtain adequate diffusion barrier liner coverage, collimated reactive sputtered, physical vapor deposition (PVD) of TaN, Ti/TiN, TiN, WN liners, which form metal copper diffusion barriers and adhesion aids, is utilized. The conformal liner lines the trench.

Next in the process is the blanket deposition of a copper seed layer by physical vapor deposition (PVD) or sputtering. Note, the conformal film lines the trench.

The next process step is the first embodiment of this invention. It is the selective polishing back of the seed layer over the insulator by a special chemical mechanical polishing step (CMP), whereby the seed layer remains in the trench and only the seed layer that is over the insulator is removed. Note, this process step is performed in such a way, as to leave the blanket diffusion barrier layer in place over the insulator.

The next process step is yet another embodiment of this invention. A special, selective electrochemical deposition (ECD) of copper metal is performed, with deposition taking place only on the seed layer, which is in the trench. This auto-plating or "plate-up" occurs exclusively in the trench. This process provides good sealing around the trench perimeter and fine copper metal coverage of the trench for subsequent robust interconnects. The selective plating of copper provides a copper film that is easily removed by subsequent chemical mechanical polish (CMP) and tends to more uniform and free of the usual defects associated with CMP films.

In the final embodiments of this invention, the remaining process steps are: a special chemical mechanical polish (CMP) of excess conducting metal, in a manner to form conducting lines without deleterious dishing effects. Also, the remaining diffusion barrier material is removed from the surface where it covered the surface of the insulator.

In summary, the damascene method described by this invention utilizes a selective copper electrochemical deposition (ECD) to improve the copper metal gap-fill performance. In addition, using selective growth yields positive effects on the damascene structure, i.e., improved sealing around the damascene structure and enhanced electromigration (EM) performance of the copper. Finally, using selective copper growth reduces the non-uniformities, characteristic of the metal film during the subsequent chemical mechanical polish (CMP) process and minimizes deleterious dishing effects.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide a new and improved method of forming an integrated circuit in which special copper films are formed by a combination of physical vapor deposition (PVD) and electrochemical copper deposition (ECD). By said techniques, high aspect ratio trenches can be selectively filled with copper, which are electromigration resistant since the interconnects are formed without chemical mechanical polish (CMP) dishing effects.

As a background to the current invention, the requirement of lower resistance material has been more stringent as the device dimensions approach micron and sub-micron design ground rules. Pure copper metal lines have been one of the best choices because of copper's low resistivity and high conductivity. This invention describes the formation of copper films by using a combination of physical vapor deposition (PVD), selective chemical mechanical polish (CMP) and electrochemical copper deposition (ECD) techniques. By said techniques, high aspect ratio trenches can be filled with robust copper metal without the problem of dishing.

Figure 1:
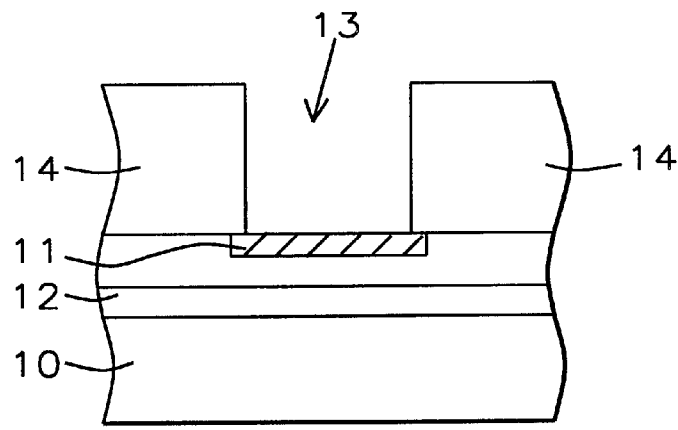
FIG. 1, which in cross-sectional representation illustrates the initial starting point for the invention, the damascene structure, trench structure.

Referring to FIG. 1, which in cross-sectional representation, sketches the starting point for this invention. As a background, provided by Prior Art methods are the following: a semiconductor silicon substrate 10 with the first level of metal copper wiring 11 being defined, on the first layer of insulator 12, silicon oxide $SiO_x$. The invention starts with these conventional layers being provided by Prior Art methods, in addition, to patterned and etched trenches 13 in deposited insulating material, insulator 14.

Figure 2:
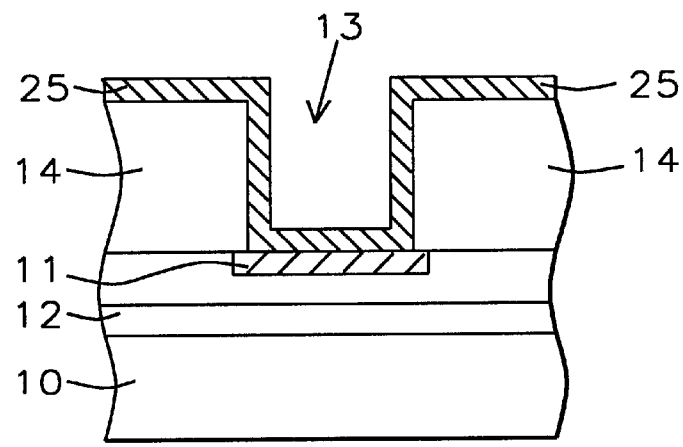
FIG. 2, which in cross-sectional representation illustrates the diffusion barrier layer deposition.

Referring to FIG. 2, which in cross-sectional representation, sketches the starting point of this invention. A metal diffusion barrier (25) layer, which will be beneath subsequent metal copper wiring layers, is blanket deposited over the insulator 14 and over the trench 13. To obtain adequate diffusion barrier liner coverage, collimated reactive sputtered with $N_2$, physical vapor deposition (PVD), of TaN, Ti/TiN, TiN, WN liners, which form metal copper diffusion barriers and adhesion aids, is utilized. The film thickness is from about 100 to 1,000 Angstroms. The conformal liner lines the trench 13 and can also be deposited by chemical vapor deposition (CVD) techniques. The diffusion barrier liner material, which also aids adhesion, is selected from the group consisting of TaN, TiN, WN and can be formed by reactive sputtering, thickness from 100 to 1,000 Angstroms.

Figure 3:
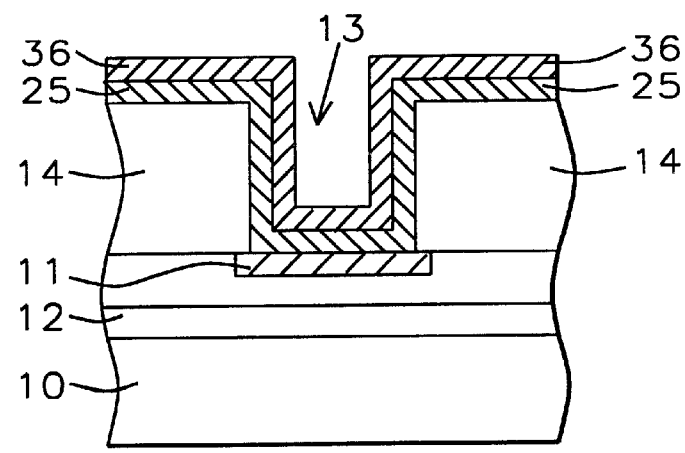
FIG. 3, which in cross-sectional representation illustrates the seed layer deposition.

Referring to FIG. 3, which in cross-sectional representation illustrates the blanket deposition of a copper seed layer 36 by physical vapor deposition (PVD), DC Magnetron sputtering a film thickness from about 50 to 1,000 Angstroms, over the diffusion barrier 25. Note, the conformal film lines the trench 13. The sputtering conditions for the copper seed layer are: Ar gas, pressure of about 1 to 100 mTorr, power from about 50 to 1,000 Watts, DC volts of from about 50 to 200 Volts, deposition rate from about 10 to 1,000 Angstroms/min. The thin conformal seed layer, thickness from about 50 to 1,000 Angstroms, can also be a copper alloy and is selected from the group consisting of both copper and copper alloys, with chemical formulae: Cu, $CuAl_x$, $CuTi_x$, $CuSn_x$, $CuZn_x$ alloys, sputtered from a target which contains the copper and copper alloy material, by physical vapor deposition.

Figure 4:
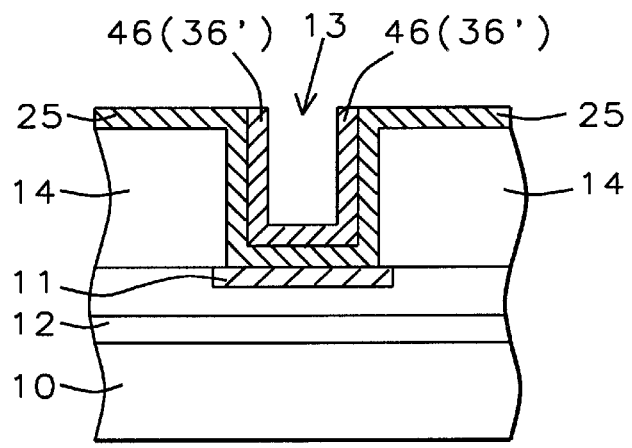
FIG. 4, which in cross-sectional representation illustrates the special chemical mechanical polish (CMP) step selectively removing the seed layer over the insulator, leaving the diffusion barrier layer over the insulator.

Referring to FIG. 4, which in cross-sectional representation illustrates the next process step is the first embodiment of this invention. Shown is the effect of polishing back the seed layer 46 (36') over the insulator 14 by a special chemical mechanical polishing step (CMP), whereby the seed layer remains in the trench 46 and is removed from over the insulator. Note, the blanket diffusion barrier layer 25 is still in place. The special CMP conditions are the following: endpoint detection in place, speed 3 to 10 rpm, pad material PZ., PAZ., pad pressure 2 to 10 psi, temperature of 25° C., removal rate of about 10 to 500 nm per minute.

Figure 5:
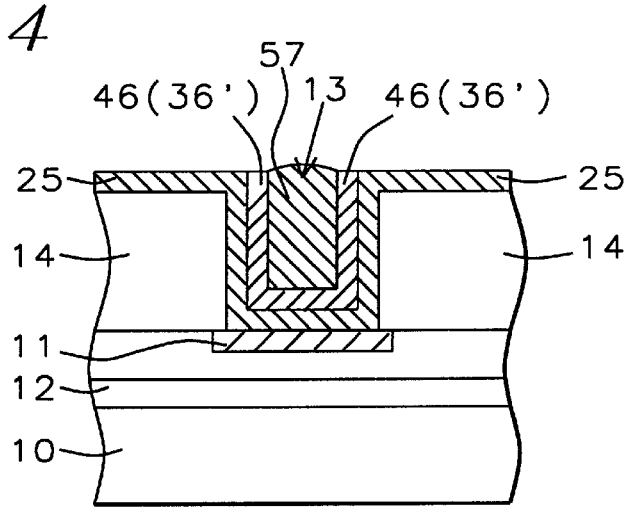
FIG. 5, which in cross-sectional representation illustrates the special selective ECD, electrochemical copper deposition, auto-plating copper in the trench only, "plate-up technique".

Referring to FIG. 5, which in cross-sectional representation illustrates the next process step is yet another embodiment of this invention. Shown is a special, selective electrochemical deposition (ECD) of copper metal 57 shown taking place only on the seed layer 46 (36') in the trench. This auto-plating or "plate-up" occurs only in the trench and provides good sealing around the trench perimeter and fine copper metal coverage of the trench for subsequent interconnects. The selective plating of copper provides a copper film that is easily removed by subsequent chemical mechanical polish (CMP) and tends to more uniform and free of the usual defects associated with CMP films. The special electrochemical copper deposition (ECD) conditions are the following: solution composed of sulfuric acid with an additive, temperature of 25° C., deposition rate of about 100 to 500 nm per minute. The robust copper metal being selectively deposited by electrochemical deposition (ECD) only in the trench, over the copper seed layer, for a copper thickness from about 2,000 to 20,000 Angstroms.

Figure 6:
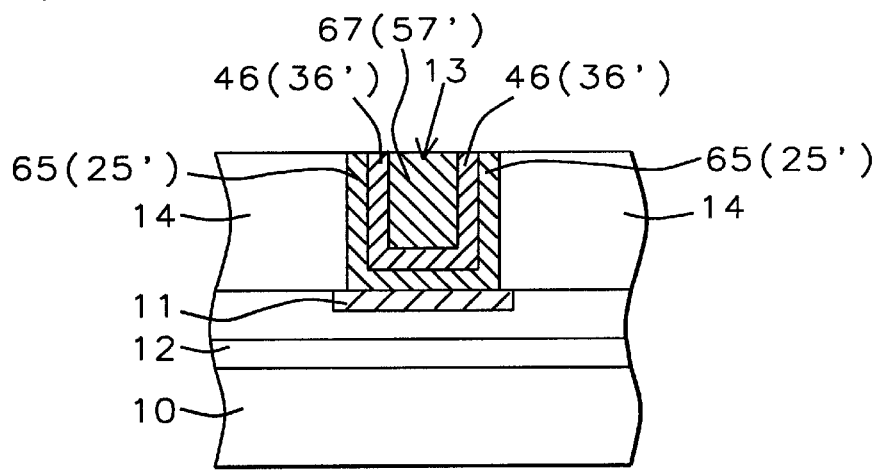
FIG. 6, which in cross-sectional representation illustrates the final processing steps, the special selective chemical mechanical polish (CMP) back of the excess copper metal plate-up in trench and the removal of diffusion barrier layer on the surface of the insulator.

Referring FIG. 6, which in cross-sectional representation, sketches the final embodiments of this invention. The final process steps are a special chemical mechanical polish (CMP) of excess conducting copper metal, in a manner to form conducting lines 67 (57') without deleterious dishing effects. Note, the remaining diffusion barrier material 65 (25') has been removed from the surface of the insulator 14. The special CMP process details to remove Cu and TaN on oxide are: endpoint detection in place, speed 3 to 30 rpm, pad material PZ, PAZ, pressure 2 to 10 psi, temperature 25° C. time, removal rate of about 10 to 100 nm per minute.

In summary, the damascene method described by this invention utilizes a selective copper electrochemical deposition (ECD) to improve the copper metal gap-fill performance. In addition, using selective growth yields positive effects on the damascene structure, i.e., improved sealing around the damascene structure and enhanced electromigration (EM) performance of the copper. Finally, using selective copper growth, reduces the non-uniformities characteristic of the metal film during the subsequent chemical mechanical polish (CMP) process, which minimizes deleterious dishing effects.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit on a substrate, the method comprising:

providing a semiconductor substrate;

providing a substrate having a layer of dielectric, inter-level dielectric, or an interconnect line layer;

providing a first level of conducting wiring being defined and embedded in a first layer of insulator;

providing patterned and etched trenches in deposited insulator;

blanket depositing a trench diffusion barrier liner material which is a diffusion barrier layer over the insulator and into the trenches;

blanket depositing a seed layer by physical vapor deposition (PVD) over the diffusion barrier liner material;

polishing off by chemical mechanical polish only the seed layer that is over the insulator leaving a remaining seed layer only in the trench;

depositing metal by electrochemical deposition by a selective method on the remaining seed layer, only in the trench forming excess metal;

polishing back the excess metal by chemical mechanical polish, which planarizes the surface;

removing the diffusion barrier layer selectively, only over the insulator;

thus, repeating the above process steps, interconnects for multilevel conducting layers are fabricated by this integrated method.

2. The method of claim 1, wherein the substrate is a semiconductor comprised of single crystal silicon.

3. The method of claim 1, wherein the diffusion barrier liner material, which also aids adhesion, is selected from the group consisting of TaN, TiN, WN and can be formed by reactive sputtering.

4. The method of claim 1, wherein the seed layer, thickness from about 50 to 1,000 Angstroms, is selected from the group consisting of copper, and copper alloys sputtered from a target which contains the copper, and copper alloy material, by physical vapor deposition.

5. The method of claim 1, wherein the chemical mechanical polish selectively removes the seed layer that is over the insulator, while leaving a remaining seed layer intact only in the trench.

6. The method of claim 1, wherein the metal copper, is selectively deposited by electrochemical deposition only in the trench over the seed layer.

7. The method of claim 1, wherein the excess metal in the trench is polished back and removed by a chemical mechanical polish technique that forms copper interconnects without dishing.

8. The method of claim 1, wherein the interconnects are fabricating by repeating the integrated process described herein, with good trench sealing features and good electomigration resistance.

9. The method of claim 1, wherein each level of interconnects is planarized by removing excess metal, planarization by chemical mechanical polish.

10. The method of claim 1, wherein the copper interconnects produced by this process, have good fill properties for high aspect ratio trenches, hence improving reliability.

11. The method of claim 1, wherein the copper interconnect fabricated by this selective growth process maintain full cross-sections of conducting material and improve electrical circuit performance by lowering resistance.

12. A method of fabricating an integrated circuit on a substrate to form robust copper interconnect lines comprising the following steps:

providing a semiconductor substrate;

providing a substrate having a layer of dielectric, inter-level dielectric, or an interconnect line layer;

providing a first level of conducting wiring being defined and embedded in a first layer of insulator, a silicon oxide;

providing patterned and etched trenches in deposited first layer of insulator, a silicon oxide;

blanket depositing a conformal trench diffusion barrier liner material selected from the group consisting of TaN, TiN, WN, forming a diffusion barrier layer over the insulator and into the trench;

blanket depositing a conformal seed layer by physical vapor deposition over the diffusion barrier layer;

polishing off by chemical mechanical polish only the seed layer that is over the insulator, a silicon oxide, leaving a remaining seed layer only in the trench;

depositing copper metal by electrochemical deposition using a selective method, auto plating on the remaining seed layer, only in the trench forming excess copper metal;

polishing back the excess copper metal by a special chemical mechanical polish, which planarizes the surface without deleterious dishing effects;

removing the diffusion barrier layer selectively, only over the insulator, a silicon oxide;

thus, repeating the above process steps, interconnects of copper metal are fabricated in multilevel conducting layers by this robust, integrated method.

13. The method of claim 12, wherein the substrate is a semiconductor comprised of single crystal silicon.

14. The method of claim 12, wherein the diffusion barrier liner material, which also aids adhesion, is selected from the group consisting of TaN, TiN, WN and can be formed by reactive sputtering, thickness from 100 to 1,000 Angstroms.

15. The method of claim 12, wherein the seed layer, thickness from about 50 to 1,000 Angstroms, is selected from the group consisting of copper and copper alloys, with chemical formulae: Cu, $CuAl_x$, $CuTi_x$, $CuSn_x$, $CuZn_x$ alloys, sputtered from a target which contains the copper and copper alloy material, by physical vapor deposition.

16. The method of claim 12, wherein the chemical mechanical polish selectively removes the seed layer that is over the insulator, while leaving a remaining seed layer intact only in the trench.

17. The method of claim 12, wherein the metal copper, is selectively deposited by electrochemical deposition only in the trench over the seed layer, the metal, Cu thickness approximately from 2,000 to 20,000 Angstroms.

18. The method of claim 12, wherein the excess copper metal in the trench is polished back and removed by a chemical mechanical polish technique that forms copper interconnects without dishing.

19. The method of claim 12, wherein the interconnects are fabricating by repeating the integrated process described herein, with good trench sealing features and good electomigration resistance.

20. The method of claim 12, wherein each level of interconnects is planarized by removing excess metal, planarization by chemical mechanical polish.

21. The method of claim 12, wherein the copper interconnects produced by this process, have good fill properties for high aspect ratio trenches, hence improving reliability.

22. The method of claim 12, wherein the copper interconnect fabricated by this selective growth process maintain full cross-sections of conducting material and improve electrical circuit performance by lowering resistance.

23. A method of fabricating an integrated circuit on a substrate to form robust copper interconnect lines comprising the following steps:
   providing a semiconductor substrate;
   providing a substrate having a layer of dielectric, interlevel dielectric, or an interconnect line layer;
   providing a first level of conducting wiring being defined, embedded in a first layer of insulator, a silicon oxide;
   providing patterned and etched trenches, with high aspect ratios, in deposited insulating material, a silicon oxide;
   blanket depositing a conformal trench diffusion barrier liner material selected from the group consisting of TaN, TiN, WN, forming a diffusion barrier layer over the insulator and into the trench;
   blanket depositing a conformal seed layer by physical vapor deposition over the diffusion barrier layer;
   polishing off by selective chemical mechanical polish only the seed layer that is over the insulator, a silicon oxide, leaving a remaining seed layer only in the trench;
   depositing copper metal by electrochemical deposition using a selective method, auto plating on the remaining seed layer, only in the trench forming excess copper metal;
   polishing back the excess copper metal by a special chemical mechanical polish, which planarizes the surface without deleterious dishing effects;
   removing the diffusion barrier layer selectively, only over the insulator, a silicon oxide;
   thus, repeating the above process steps, interconnects of copper metal are fabricated in multilevel conducting layer applications.

24. The method of claim 23, wherein the substrate is a semiconductor comprised of single crystal silicon.

25. The method of claim 23, wherein the diffusion barrier liner material, which also aids adhesion, is selected from the group consisting of TaN, TiN, WN and can be formed by reactive sputtering, thickness from 100 to 1,000 Angstroms.

26. The method of claim 23, wherein the seed layer, thickness from about 50 to 1,000 Angstroms, is selected from the group consisting of copper and copper alloys, with chemical formulae: Cu, $CuAl_x$, $CuTi_x$, $CuSn_x$, $CuZn_x$ alloys, sputtered from a target which contains the copper and copper alloy material, by physical vapor deposition.

27. The method of claim 23, wherein the chemical mechanical polish selectively removes the seed layer that is over the insulator, while leaving a remaining seed layer intact only in the trench.

28. The method of claim 23, wherein the metal copper, is selectively deposited by electrochemical deposition only in the trench over the seed layer, the metal, Cu thickness approximately from 2,000 to 20,000 Angstroms.

29. The method of claim 22, wherein the excess copper metal in the trench is polished back and removed by a chemical mechanical polish technique that forms copper interconnects without dishing.

30. The method of claim 23, wherein the interconnects are fabricating by repeating the integrated process described herein, with good trench sealing features and good electomigration resistance.

31. The method of claim 23, wherein each level of conducting structure is planarized by removing excess conducting material, planarization by chemical mechanical polish (CMP).

32. The method of claim 23, wherein the copper interconnects produced by this process, have good fill properties for high aspect ratio trenches, hence improving reliability.

33. The method of claim 23, wherein the copper interconnect fabricated by this selective growth process maintain full cross-sections of conducting material and improve electrical circuit performance by lowering resistance.

* * * * *